(12) United States Patent
Gu

(10) Patent No.: US 12,142,618 B2
(45) Date of Patent: Nov. 12, 2024

(54) IMAGE SENSOR INCLUDING ISOLATION REGION FOR REMOVING PHOTOCHARGES

(71) Applicant: SK hynix Inc., Icheon-si (KR)

(72) Inventor: Tae Lim Gu, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 624 days.

(21) Appl. No.: 17/097,908

(22) Filed: Nov. 13, 2020

(65) Prior Publication Data

US 2021/0343765 A1 Nov. 4, 2021

(30) Foreign Application Priority Data

Apr. 29, 2020 (KR) ........................ 10-2020-0052730

(51) Int. Cl.
H01L 27/146 (2006.01)
(52) U.S. Cl.
CPC .. H01L 27/14607 (2013.01); H01L 27/14605 (2013.01); H01L 27/1463 (2013.01); H01L 27/14643 (2013.01)
(58) Field of Classification Search
None
See application file for complete search history.

(56) References Cited

U.S. PATENT DOCUMENTS

| 9,029,972 B2 | 5/2015 | Nagaraja |
| 10,304,886 B2 | 5/2019 | Chiang et al. |
| 2011/0068429 A1 | 3/2011 | Venezia |
| 2011/0241089 A1 | 10/2011 | Ohri et al. |
| 2017/0244921 A1 | 8/2017 | Velichko |
| 2018/0026073 A1 | 1/2018 | Tsuboi et al. |
| 2018/0190709 A1 | 7/2018 | Lee et al. |
| 2019/0148427 A1* | 5/2019 | Lee ...................... H01L 23/481 257/446 |
| 2019/0165018 A1 | 5/2019 | Park et al. |

(Continued)

FOREIGN PATENT DOCUMENTS

| CN | 101872775 A | 10/2010 |
| CN | 103972258 A | 8/2014 |

(Continued)

OTHER PUBLICATIONS

Request for the Submission of an Opinion mailed May 22, 2024 for KR Appl. No. 10-2020- 0052730, 12 pages with translation.

(Continued)

Primary Examiner — Nilufa Rahim
(74) Attorney, Agent, or Firm — Perkins Coie LLP

(57) ABSTRACT

An image sensing device is provided to include a first photoelectric conversion element and a second photoelectric conversion element that are arranged adjacent to each other; a first isolation region located between the first and second photoelectric conversion elements and configured to receive a voltage to generate an electric field to attract photocharges from the first or second photoelectric conversion element; and a second isolation region separated from the first isolation region, the second isolation region located between the first and second photoelectric conversion elements and structured to include an insulation material to block photocharges from moving between the first and second photoelectric conversion elements.

16 Claims, 4 Drawing Sheets

(56) References Cited

U.S. PATENT DOCUMENTS

| | | | | |
|---|---|---|---|---|
| 2020/0343294 A1* | 10/2020 | Oh | .................... | H01L 27/14685 |
| 2020/0344433 A1* | 10/2020 | Fujita | .................. | H01L 27/1464 |
| 2020/0403015 A1* | 12/2020 | Suzuki | ................. | H04N 25/135 |
| 2021/0193703 A1* | 6/2021 | Watanabe | .......... | H01L 27/14605 |
| 2021/0210532 A1* | 7/2021 | Hung | ................. | H01L 27/14627 |
| 2022/0013552 A1* | 1/2022 | Baek | .................. | H01L 27/1461 |
| 2022/0013554 A1* | 1/2022 | Mun | ................. | H01L 27/14603 |
| 2022/0045110 A1* | 2/2022 | Fujita | .................. | H04N 25/704 |
| 2022/0109012 A1* | 4/2022 | Moon | ............... | H01L 27/14621 |

FOREIGN PATENT DOCUMENTS

| | | |
|---|---|---|
| CN | 104134677 A | 11/2014 |
| CN | 109728017 A | 5/2019 |
| CN | 109786403 A | 5/2019 |
| CN | 109950269 B | 8/2021 |
| JP | 2006229105 A | 8/2006 |
| JP | 2013145933 A | 7/2013 |
| JP | 2014225647 A | 12/2014 |
| JP | 6231741 B2 | 11/2017 |
| KR | 20180080420 A | 7/2018 |

OTHER PUBLICATIONS

Notification to Grant Patent Right for Invention mailed Jun. 3, 2024 for CN Appl. No. 202011204856.2, 7 pages with translation.

* cited by examiner

IMAGE SENSOR INCLUDING ISOLATION REGION FOR REMOVING PHOTOCHARGES

CROSS-REFERENCE TO RELATED APPLICATION

This patent document claims the priority and benefits of Korean patent application No. 10-2020-0052730, filed on Apr. 29, 2020, the disclosure of which is incorporated herein by reference in its entirety as part of the disclosure of this patent document.

TECHNICAL FIELD

The technology and implementations disclosed in this patent document generally relate to an image sensor including a plurality of pixels arranged contiguous (or adjacent) to each other.

BACKGROUND

An image sensor is a device for capturing optical images by converting light into electrical signals using a semiconductor material that reacts to light. With the recent development of automotive, medical, computer and communication industries, the demand for high-performance image sensors is increasing in various devices, such as smartphones, digital cameras, game consoles, Internet of Things (IoT), robots, surveillance cameras, medical micro-cameras, etc.

Image sensors may be broadly classified into a CCD (Charge Coupled Device)-based image sensor and a CMOS (Complementary Metal Oxide Semiconductor)-based image sensor. The CCD image sensors may create high-quality, low-noise images, and traditionally have advantages over the CMOS image sensor in terms of noise characteristics. However, CMOS image sensors are now widely used due to certain advantages over the CCD counterparts, including, e.g., higher frame rates and shutter speed. In addition, CMOS image sensors and signal processing circuitry can be integrated into a single chip, making it possible to miniaturize electronic devices while achieving lower power consumption. Further, using the CMOS fabrication technology can result in reduction in the production costs. Such characteristics of the CMOS image sensors make these sensors better suited for implementations in mobile devices.

SUMMARY

Various embodiments of the disclosed technology relate to an image sensor capable of reducing crosstalk between contiguous (or adjacent) pixels.

In accordance with an embodiment of the disclosed technology, an image sensor may include a first photoelectric conversion element and a second photoelectric conversion element that are arranged adjacent to each other, a first isolation region disposed between the first photoelectric conversion element and the second photoelectric conversion element, and configured to absorb overflown photocharges from the first photoelectric conversion element or the second photoelectric conversion element, and a second isolation region disposed between the first photoelectric conversion element and the second photoelectric conversion element, and configured to prevent movement of the overflown photocharges.

In another aspect, an image sensor is provided to comprise: a first photoelectric conversion element and a second photoelectric conversion element that are arranged adjacent to each other, each of the first photoelectric conversion element and the second photoelectric conversion element configured to generate photocharges in response to incident light; a first isolation region located between the first photoelectric conversion element and the second photoelectric conversion element to isolate the first and second photoelectric conversion elements, and configured to receive a voltage to generate an electric field to attract photocharges from the first photoelectric conversion element or the second photoelectric conversion element so as to isolate the first and second photoelectric conversion elements from each other; and a second isolation region separated from the first isolation region, the second isolation region located between the first photoelectric conversion element and the second photoelectric conversion element and structured to include an insulation material to block photocharges from moving between the first and second photoelectric conversion elements.

In accordance with another embodiment of the disclosed technology, an image sensor may include first to fourth photoelectric conversion elements formed in a (2×2) matrix structure while being adjacent to each other, a first isolation region disposed at a center portion of the (2×2) matrix structure, and configured to absorb overflown photocharges from the first to fourth photoelectric conversion elements, and a second isolation region disposed between two adjacent photoelectric conversion elements from among the first to fourth photoelectric conversion elements, and configured to physically prevent movement of the overflown photocharges.

In another aspect, an image sensor is provided to include: first to fourth photoelectric conversion elements formed in a (2×2) matrix structure, each of the first to fourth photoelectric conversion element configured to generate photocharges in response to receiving incident light; a first isolation region disposed at a center portion of the (2×2) matrix structure, and configured to receive a voltage to generate an electric field to attract photocharges from the first to fourth photoelectric conversion elements; and a second isolation region disposed between two adjacent photoelectric conversion elements, and configured to physically prevent movement of photocharges.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
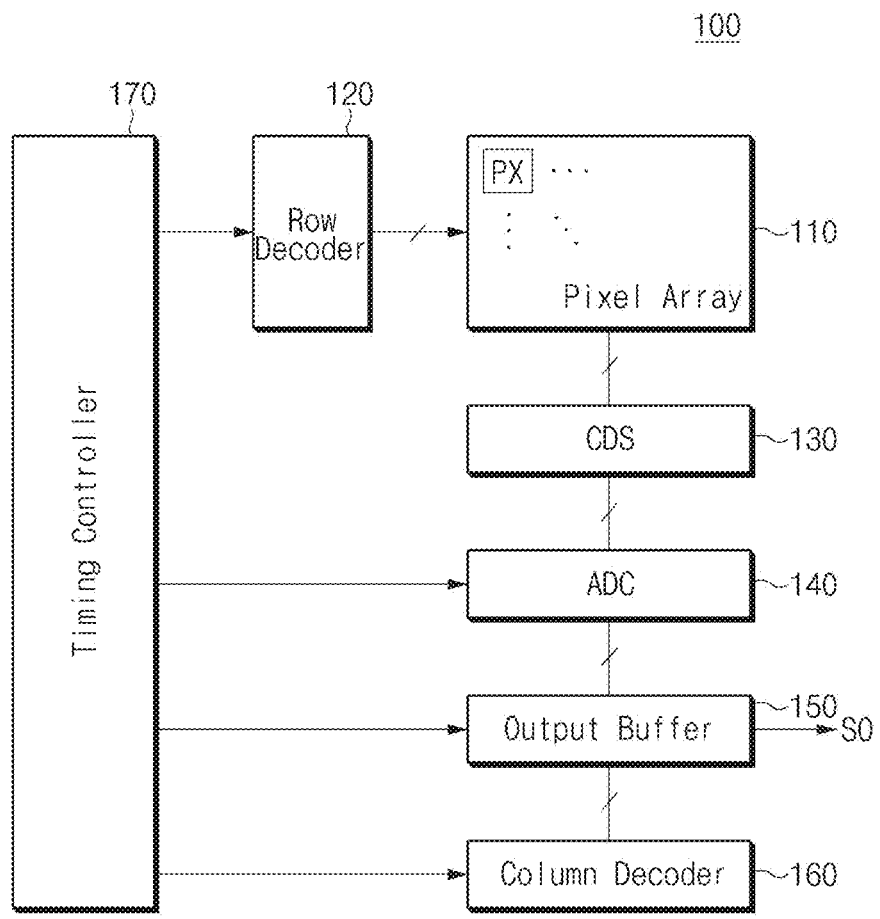
FIG. 1 is a block diagram illustrating an example of an image sensor based on some implementations of the disclosed technology.

This patent document provides implementations and examples of an image sensor that substantially addresses one or more issues due to limitations and disadvantages of the related art. Some implementations of the disclosed technology relate to the image sensor capable of reducing crosstalk between contiguous (or adjacent) pixels. The disclosed technology provides various implementations of an image sensor which can electrically and physically prevent overflown photocharges from being transferred between the contiguous (or adjacent) photoelectric conversion elements. By doing so, it is possible to reduce noise generated in the image sensor.

Reference will now be made in detail to the embodiments of the disclosed technology, examples of which are illustrated in the accompanying drawings. Wherever possible, the same reference numbers will be used throughout the drawings to refer to the same or like parts. While the disclosure is susceptible to various modifications and alternative forms, specific embodiments thereof are shown by way of example in the drawings.

FIG. 1 is a block diagram illustrating an example of an image sensor 100 based on some implementations of the disclosed technology.

Referring to FIG. 1, the image sensor 100 may be implemented as a complementary metal oxide semiconductor (CMOS) image sensor. In the example, the image sensor 100 may include a pixel array 110, a row decoder 120, a correlated double sampler (CDS) circuit 130, an analog-to-digital converter (ADC) 140, an output buffer 150, a column decoder 160, and a timing controller 170. In this case, the above-mentioned constituent elements of the image sensor 100 are merely examples, and at least some constituent elements from among the constituent elements may be added to or omitted from the image sensor 100 as necessary.

The pixel array 110 may include a plurality of unit pixels arranged in a two-dimensional (2D) shape including rows and columns. The plurality of unit pixels may convert an optical signal into an electrical signal. One or more unit pixels may share at least one circuit element of the image sensor such that those unit pixels can operate on a shared pixel basis to convert an optical signal into an electrical signal. Although each unit pixel or each shared pixel may correspond to a 3T pixel (3 transistors per pixel), a 4T pixel (4 transistors per pixel), or a 5T pixel (3 transistors per pixel), other implementations are also possible. The pixel array 110 may receive a drive signal that includes a row selection signal, a pixel reset signal, a transmission (Tx) signal, and others from the row decoder 120, and may be driven by the drive signal received from the row decoder 120.

The row decoder 120 may activate the pixel array 110 based on control signals of the timing controller 170. In some implementations, the row decoder 120 may select at least one row from the pixel array 110. The row decoder 120 may generate a row selection signal to select at least one of a plurality of rows. The row decoder 120 may sequentially enable a pixel reset signal for resetting pixels corresponding to at least one selected row, and a transmission (Tx) signal for the selected pixels to transmit electrical signals generated by the pixels. As a result, an analog-type reference signal and an image signal that are generated from each pixel of the selected row may be sequentially transmitted to the CDS circuit 130. In the context of this patent document, the term "pixel signal" can be used to indicate the reference signal and the image signal. The reference signal may be used to remove an offset (e.g., reset noise, etc.) from the image signal.

CMOS image sensors may use the correlated double sampling (CDS) to remove undesired offset values of pixels known as the fixed pattern noise by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the CDS circuit 130 may sequentially sample and hold the reference signal and the image signal that are transferred from the pixel array 110 to each of the plurality of column lines. The CDS circuit 130 may sample and hold voltage levels of the reference signal and the image signal that corresponding to each column of the pixel array 110.

The CDS circuit 130 may transmit a correlated double sampling (CDS) signal corresponding to the reference signal and the image signal for each column to the ADC 140 upon receiving a control signal from the timing controller 170.

The ADC 140 is used to convert analog CDS signals to digital signals. Examples of the ADC 140 may include a ramp-compare type ADC where the analog pixel signal is compared with a reference signal such as a ramp signal that ramps up or down and a timer counts until a voltage of the ramp signal matches the analog pixel signal. In some embodiments of the disclosed technology, the ADC 140 may receive the CDS signal for each column from the CDS circuit 130, may convert the received CDS signal into a digital signal, and may thus output the digital signal. In some implementations, the ADC 140 samples an input signal (e.g., pixel signal) multiple times using the reference signal and analog-to-digital convert the sampled input signals by counting the number of clock pulses until crossing points. The ADC 140 may perform counting and calculation operations based on the CDS signal for each column and a ramp signal received from the timing controller 170, such that the ADC 140 may generate digital image data from which noise (for example, unique reset noise for each pixel) corresponding to each column is removed.

The ADC 140 may include a plurality of column counters corresponding to respective columns of the pixel array 110, and may convert the CDS signal for each column into a digital signal using the column counters, resulting in formation of image data. In another embodiment, the ADC 140 may include a single global counter, and may convert a CDS signal corresponding to each column into a digital signal using a global code received from the global counter.

The output buffer 150 may receive image data for each column received from the ADC 140. In addition, the output buffer 150 may capture the received image data, and may output the captured image data. The output buffer 150 may temporarily store image data that is output from the ADC 140 upon receiving a control signal from the timing controller 170. The output buffer 150 may operate as an interface configured to compensate for data rate difference or transmission (Tx) speed difference between the image sensor 100 and another device coupled to the image sensor 100.

The column decoder 160 may select a column of the output buffer 150 upon receiving a control signal from the timing controller 170, and may sequentially output the image data temporarily stored in the output buffer 150. In some implementations, the column decoder 160 may receive an address signal from the timing controller 170, may generate a column selection signal based on the received address signal, and may select a column of the output buffer 150 to output image data to be output as an output signal S0 from the selected column of the output buffer 150.

The timing controller 170 may control the row decoder 120, the ADC 140, the output buffer 150, and the column decoder 160.

The timing controller 170 may transmit a clock signal for operating or synchronizing the constituent elements of the image sensor 100, a control signal needed for timing control, and address signals needed for selection of a row or column to the row decoder 120, the column decoder 160, the ADC 140, and the output buffer 150. In some implementations, the timing controller 170 may include a logic control circuit, a phase locked loop (PLL) circuit, a timing control circuit, a communication interface circuit, etc.

Figure 2:
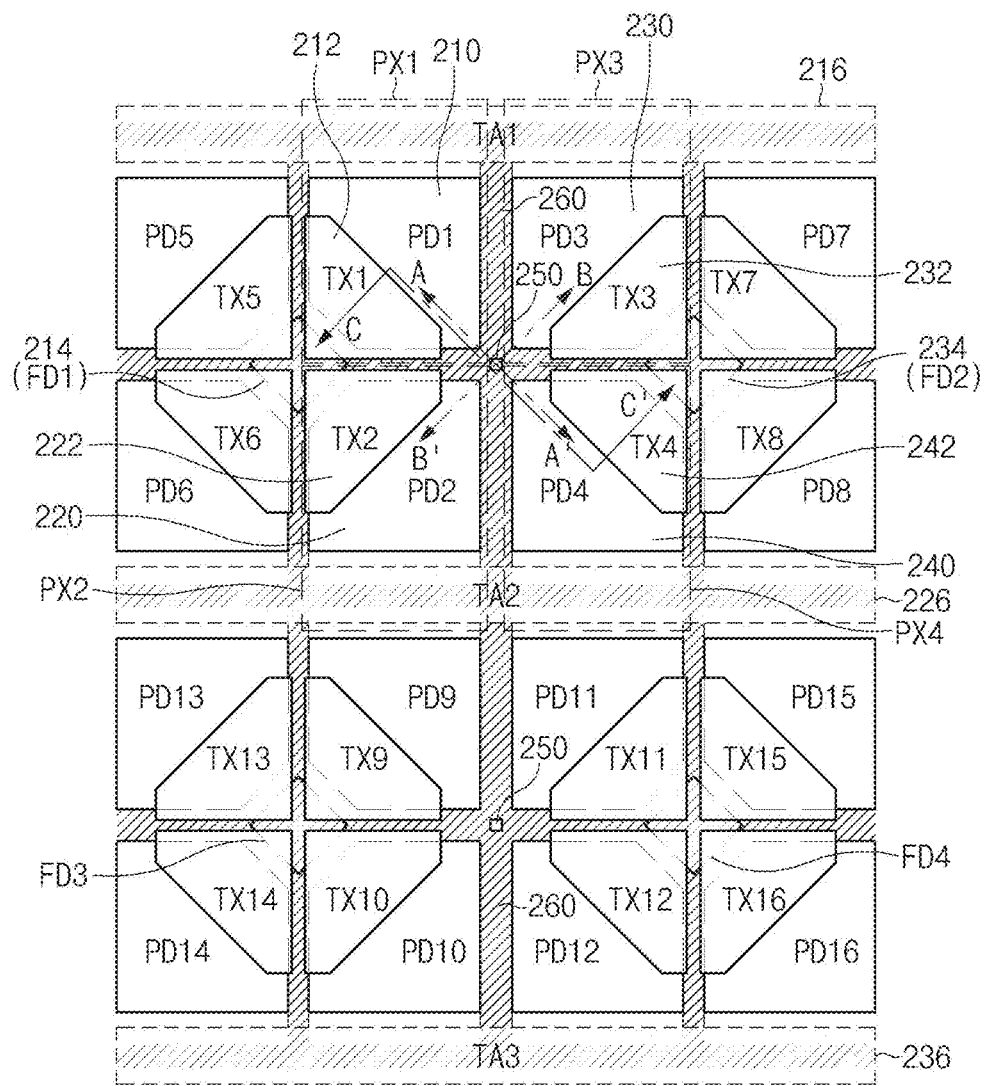
FIG. 2 is a schematic diagram illustrating one example of some parts of a pixel array shown in FIG. 1 based on some implementations of the disclosed technology.

FIG. 2 is a schematic diagram illustrating one example of some parts of the pixel array 110 shown in FIG. 1 based on some implementations of the disclosed technology.

Figure 3:
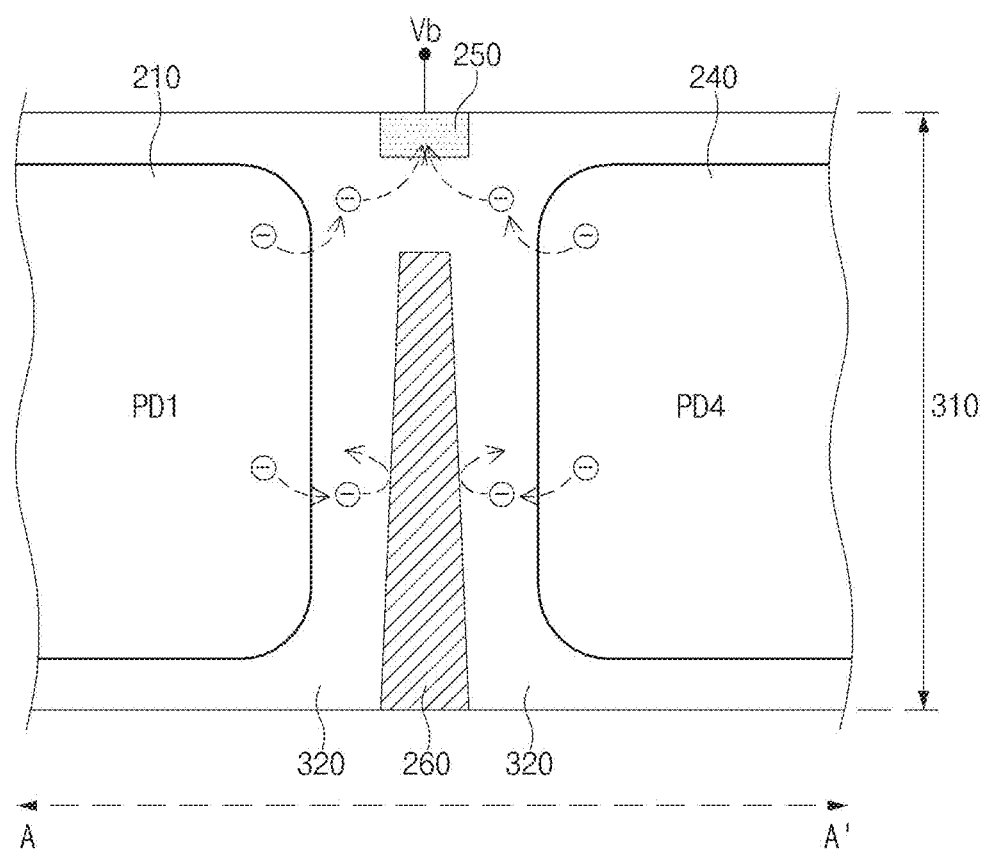
FIG. 3 is a cross-sectional view illustrating one example of the pixel array taken along a first cutting line shown in FIG. 2 based on some implementations of the disclosed technology.

Referring to FIG. 2, the pixel array 110 includes different unit pixels (e.g., PD1 through PD 16) that are supported by a substrate, as further explained with respect to FIG. 3. As an example, a portion 200 of the pixel array 110 is shown to include 16 unit pixels. Among 16 unit pixels, only 4 unit pixels (PX1 to PX4) are denoted in FIG. 2 as an example. Other unit pixels contained in the pixel array 110 may have similar structures and operate in a similar manner. In addition, although each of the unit pixels PX1~PX4 has a shared pixel structure in which pixels arranged in (2×2) matrix structure share at least some elements, other implementations are also possible. For example, a number of pixels arranged in an array can share a photoelectric conversion element and form a unit pixel.

The first unit pixel PX1 may include a first photoelectric conversion element (PD1) 210 that absorbs incident light and generates photocharges, a first transfer gate (TX1) 212 coupled to the PD1 to transfer the photocharges out to a portion of the first floating diffusion (FD) region 214 to generate a pixel output for PDI, and a portion of the first transistor region (TA1) 216 that includes a corresponding pixel circuit for the PD1. Specifically, the example shown in FIG. 2 is based on a shared pixel design where four adjacent unit pixels form a pixel group that share certain pixel circuit elements. For example, the 16 unit pixels PX1-PX16 are shown to be in four groups, a first group of PX1, PX2, PX5 and PX6, a second group of PX3, PX4, PX7 and PX8, a third group of PX9, PX 10, PX13 and PX14 and a fourth group of PX11, PX12, PX15 and PX16. With each group, the four unit pixels share the same floating diffusion region for collecting generated photocharges and the same shared pixel circuit for pixel operations including pixel readout. For example, in some implementations, the shared pixel circuit for the four adjacent unit pixels may include a shared reset transistor for resetting the shared floating diffusion region, a shared source follower to sensing and reading out the signal in the shared floating diffusion region and a shared selection transistor for the selection operation. This shared circuit can be operated to generate, the individual unit pixel output for each of the four unit pixels in each group by controlling their respective transfer gate (e.g., TX1).

The first photoelectric conversion element 210 may generate and accumulate photocharges corresponding to intensity of incident light on the image sensor. The photoelectric conversion element 210 may be arranged across as large a region as possible to increase a fill factor indicating light reception (Rx) efficiency. For example, the photoelectric conversion element 210 may also be implemented as a photodiode, a phototransistor, a photogate, a pinned photodiode or a combination thereof.

If the photoelectric conversion element 210 is implemented as a photodiode, the photoelectric conversion element 210 may be formed as an N-type doped region through ion implantation of N-type ions in a substrate including P-type impurities. In some implementations, the photodiode may be formed by stacking a plurality of doped regions. In this case, a plurality of doped regions may include a P-type impurity layer and an N-type impurity layer, and the N-type impurity layer may include an $N^+$ impurity layer and an $N^-$ impurity layer.

One terminal of the first transfer gate 212 may overlap with the photoelectric conversion element 210, and the other terminal of the first transfer gate 212 may overlap with the first floating diffusion (FD) region 214. The first transfer gate 212 may receive a first transmission control signal from the row decoder 120. The first transfer gate 212 may form a specific channel between the first photoelectric conversion element 210 and the first floating diffusion (FD) region 214 in response to the first transmission control signal, such that photocharges can be transferred between the first photoelectric conversion element 210 and the first floating diffusion (FD) region 214. That is, the first transfer gate 212 may construct a first transfer transistor that is coupled between the first photoelectric conversion element 210 and the first floating diffusion (FD) region 214 and is then turned on or off in response to the first transmission control signal.

The first transfer gate 212 may include a stacked structure of a gate insulation layer for electrical isolation and a gate electrode for receiving the first transmission control signal. Here, the stacked structure may be disposed over the substrate in which the first photoelectric conversion element 210 and the first floating diffusion (FD) region 214 are formed. For example, the gate insulation layer may be a silicon oxide film, and the gate electrode may be formed of polysilicon.

The first floating diffusion (FD) region 214 may store photocharges received from the first photoelectric conversion element 210. In addition, the first floating diffusion (FD) region 214 may store photocharges that are received from the photoelectric conversion elements PD2, PD5, and PD6 as well. Thus, the first floating diffusion (FD) region 214 is configured to store photocharges that are received from four unit pixels including the first unit pixel PX1, the second unit pixel PX2, a contiguous unit pixel arranged at the left side of the first unit pixel PX1, and a contiguous unit pixel arranged at the left side of the second unit pixel PX2. The four unit pixels construct a first shared pixel structure that shares the first floating diffusion (FD) region 214 to store the photocharges received from the photoelectric conversion elements of the unit pixels included in the first shared pixel structure.

The first floating diffusion (FD) region 214 may be a region that is doped with specific conductive-type (e.g., N-type) impurities in the substrate.

The first transistor region 216 may be disposed at one side of the first photoelectric conversion element 210, and may include at least some parts of a plurality of transistors constructing the first shared pixel.

For example, the plurality of transistors constructing the first shared pixel may include a drive transistor, a selection transistor, and a reset transistor. The drive transistor may be coupled between the selection transistor and a pixel voltage node which supplies a pixel voltage (e.g., a power-supply voltage of 2.5V, 5V, or others), and a gate of the drive transistor may be coupled to the first floating diffusion (FD) region 214. Thus, an electrical signal corresponding to a voltage level of the first floating diffusion (FD) region 214 can be generated. The selection transistor may be coupled between the drive transistor and the column line, and a gate of the selection transistor may receive a selection control signal from the row decoder 120. The selection transistor may output the electrical signal generated by the drive transistor to the column line in response to the selection control signal. In this case, the column line may be used as a signal line formed to extend in a column direction, and may be a signal line through which the pixel signal shown in FIG. 1 is output. The reset transistor may be coupled between the pixel voltage node (e.g., a power-supply voltage) and the first floating diffusion (FD) region 214, and a gate of the reset transistor may receive a reset control signal from the row decoder 120. The reset transistor may reset a voltage level of the first floating diffusion (FD) region 214 in response to the reset control signal.

In some implementations, the plurality of transistors constructing the first shared pixel can be located in the second transistor region 226 in addition to the first transistor region. In one example, at least one of the plurality of transistors constructing the first shared pixel may be implemented by parallel connection of at least two transistors.

The second unit pixel PX2 may include a second photoelectric conversion element (PD2) 220, a second transfer gate (TX2) 222, and a second transistor region (TA2) 226. The elements of the second unit pixel PX2 may be substantially identical to those included in the first unit pixel in terms of structures and operations, thus a detailed description thereof will herein be omitted. The elements of the second unit pixel PX2 may be different from those of the first unit pixel PX1 in terms of the locations. The second unit pixel PX2 may be arranged symmetrical to the first unit pixel PX1 with respect to a boundary region between the first unit pixel PX1 and the second unit pixel PX2.

The third unit pixel PX3 may be arranged symmetrical to the first unit pixel PX1 with respect to a boundary region between the first unit pixel PX1 and the third unit pixel PX3. The fourth unit pixel PX4 may be arranged symmetrical to the second unit pixel PX2 with respect to a boundary region between the second unit pixel PX2 and the fourth unit pixel PX4. The elements of the third unit pixel PX3 and the fourth unit pixel PX4 may be substantially identical to those of the first unit pixel PX1 and the second unit pixel PX2 in terms of structures and operations and thus a detailed description thereof will herein be omitted.

The third unit pixel PX3, the fourth unit pixel PX4, another unit pixel located at the right side of the third unit pixel PX3, and another unit pixel located at the right side of the fourth unit pixel PX4 may share the second floating diffusion (FD) region 234 and construct a second shared pixel structure. Therefore, photocharges generated by the seventh photoelectric conversion element PD7 and photocharges generated by the eighth photoelectric conversion element PD8 may be transmitted to and accumulated in the second floating diffusion (FD) region 234.

The fifth unit pixel configured to include the fifth photoelectric conversion element PD5, the fifth transfer gate TX5, some parts of the first floating diffusion (FD) region FD1, and some parts of the first transistor region 216 may be arranged symmetrical to the first unit pixel PX1 with respect to a boundary region between the first unit pixel PX1 and the fifth unit pixel. The sixth unit pixel configured to include the sixth photoelectric conversion element PD6, the sixth transfer gate TX6, some parts of the first floating diffusion (FD) region FD1, and some parts of the second transistor region 226 may be arranged symmetrical to the second unit pixel PX2 with respect to a boundary region between the second unit pixel PX2 and the sixth unit pixel. The elements of the fifth unit pixel and the sixth unit pixel may be substantially identical to those of the first unit pixel PX1 and the second unit pixel PX2 in terms of structures and operations, and thus a detailed description thereof will herein be omitted.

The seventh unit pixel configured to include the seventh photoelectric conversion element PD7, the seventh transfer gate TX7, some parts of the second floating diffusion (FD) region FD2, and some parts of the first transistor region 216 may be arranged symmetrical to the third unit pixel PX3 with respect to a boundary region between the third unit pixel PX3 and the seventh unit pixel. The eighth unit pixel configured to include the eighth photoelectric conversion element PD8, the eighth transfer gate TX8, some parts of the second floating diffusion (FD) region FD2, and some parts of the second transistor region 226 may be arranged symmetrical to the fourth unit pixel PX4 with respect to a boundary region between the fourth unit pixel PX4 and the eighth unit pixel. The elements of the seventh unit pixel and the eighth unit pixel may be substantially identical to those of the third unit pixel PX3 and the fourth unit pixel PX4 in terms of structures and operations, and thus a detailed description thereof will herein be omitted.

The plurality of transistors formed to construct the second shared pixel structure may be located in both of the first transistor region 216 and the second transistor region 226.

The ninth to sixteenth unit pixels may be arranged symmetrical to the first to eighth unit pixels with respect to the second transistor region 226 acting as a boundary region, and the elements of the ninth to sixteenth unit pixels may be substantially identical in terms of structures and operations to those of the first to eighth unit pixels, and as such a detailed description thereof will herein be omitted.

The plurality of transistors construct the third shared pixel structure that includes the ninth, tenth, thirteenth, and fourteenth unit pixels and the plurality of transistors constructing the fourth shared pixel structure that includes the eleventh, twelfth, fifteenth, and sixteenth unit pixels. The transistors constructing the third shared pixel structure and the fourth shared pixel structure are located in the second transistor region 226 and the third transistor region 236.

Referring to FIG. 2, a portion 200 of the pixel array may further include a first isolation region 250 and a second isolation region 260. The operations and structures of the first isolation region 250 will be further explained with reference to FIGS. 3 and 4.

The first isolation region 250 may be disposed between the contiguous (or adjacent) photoelectric conversion elements. In the example as shown in FIG. 2, when four photoelectric conversion elements 210, 220, 230, and 240 are arranged in a (2×2) matrix structure, the floating diffusion (FD) region is not disposed at the center portion of the (2×2) matrix structure and the first isolation region 250 may be disposed at the center portion of the (2×2) matrix structure formed by the photoelectric conversion elements 210, 220, 230, and 240. In some implementations, the first isolation region 250 may be disposed in a region where virtual straight lines connecting the center portions of two photoelectric conversion elements (210 and 240 or 220 and 230) that are contiguous or adjacent to each other in a diagonal direction are arranged to cross each other. The second isolation region 260 includes a portion extending along a horizontal direction and another portion extending along a vertical direction. In some implementations, the first isolation region 250 may be disposed in a region where the portion of the second isolation region 260 extending in the horizontal direction and another portion of the second isolation region 260 extending in the vertical direction are arranged to cross each other. Likewise, the first isolation region 250 may be disposed at the center portion of four contiguous photoelectric conversion elements PD9~PD12 that are arranged in a (2×2) matrix structure. In this case, a floating diffusion (FD) region is not disposed in the center portion of the (2×2) matrix structure.

In another embodiment, the first isolation region 250 may be additionally disposed not only at the position shown in FIG. 2, but also at at least one suitable position between the contiguous (or adjacent) photoelectric conversion elements (e.g., PD1 and PD3, or PD2 and PD4). The at least one suitable position is experimentally acquired, so that crosstalk between the contiguous (or adjacent) photoelectric conversion elements can be minimized.

In another embodiment, the first isolation region 250 may be disposed in a corresponding position to the second isolation region 260 in the top view shown in FIG. 2. In this case, the first isolation region 250 may have an elongated shape.

In another embodiment, the first isolation region 250 may be formed to have one or more extending portion. For example, the first isolation region 250 may have a shape having an extending portion that extends from the center portion of the four photoelectric conversion elements (e.g., 210, 220, 230, and 240) toward a space between any two of the four photoelectric conversion elements. For example, the first isolation region 250 may have four extending portions such that it has a shape similar to "+". In this example, the four extending portions may include a first extending portion extending from the center portion of the photoelectric conversion elements 210, 220, 230, and 240 toward a space between the photoelectric conversion elements 210 and 230, a second extending portion extending from the center portion toward a space between the photoelectric conversion elements 210 and 220, a third extending portion extending from the center portion toward a space between the photoelectric conversion elements 220 and 240, and a fourth extending portion extending from the center portion toward a space between the photoelectric conversion elements 230 and 240.

The first isolation region 250 may be doped with specific conductive-type (e.g., N-type) impurities. In this example, the first isolation region 250 may be formed by implanting N-type impurities into the substrate.

The first isolation region 250 may receive a bias voltage (Vb) as an input, may absorb or remove photocharges introduced into the first isolation region 250. For example, the photocharges introduced into the first isolation region 250 may be removed by being transferred to a node (or a drain node) providing the bias voltage (Vb). For example, the bias voltage (Vb) may be a power-supply voltage.

The second isolation region 260 may be disposed between the contiguous (or adjacent) photoelectric conversion elements. As can be seen from FIG. 2, the second isolation region 260 may be formed to extend in a first direction (e.g., a horizontal direction in the top view shown in FIG. 2) between the first photoelectric conversion element 210 and the second photoelectric conversion element 220 and between the third photoelectric conversion element 230 and the fourth photoelectric conversion element 240. In addition, the second isolation region 260 may be formed to extend in a second direction (e.g., a vertical direction in the top view shown in FIG. 2) perpendicular to the first direction between the first photoelectric conversion element 210 and the third photoelectric conversion element 230 and between the second photoelectric conversion element 220 and the fourth photoelectric conversion element 240.

In addition, the second isolation region 260 may be formed to extend in the second direction between the fifth photoelectric conversion element PD5 and the first photoelectric conversion element 210 of the fifth pixel PX1 and between the sixth photoelectric conversion element PD6 and the second photoelectric conversion element 220 of the sixth pixel PX6. In addition, the second isolation region 260 may be formed to extend in the first direction between the fifth photoelectric conversion element PD5 and the sixth photoelectric conversion element PD6.

Likewise, the second isolation region may be formed to extend in the second direction while being disposed between the seventh photoelectric conversion element PD7 and the third photoelectric conversion element 230 of the seventh pixel PX7 and between the eighth photoelectric conversion element PD8 and the fourth photoelectric conversion element 240 of the eighth pixel PX8. In addition, the second isolation region 260 may be formed to extend in the first direction between the seventh photoelectric conversion element PD7 and the eighth photoelectric conversion element PD8.

In addition, the second isolation region 260 may be formed to extend in the first direction while being disposed over the first, third, fifth, and seventh photoelectric conversion elements PD1, PD3, PD5, and PD7. In FIG. 2, although FIG. 2 illustrates that the second isolation region 260 disposed over the first, third, fifth, and seventh photoelectric conversion elements PD1, PD3, PD5, and PD7 overlaps with the first transistor region 216, other implementations are also possible.

The second isolation region 260 may be formed to extend in the first direction while being disposed over the second, fourth, sixth, and eighth photoelectric conversion elements PD2, PD4, PD6, and PD8. In FIG, 2, although FIG. 2 illustrates that the second isolation region 260 disposed over the second, fourth, sixth, and eighth photoelectric conversion elements PD2, PD4, PD6, and PD8 overlaps with the second transistor region 226, other implementations are also possible.

In some implementations, the second isolation region 260 may be disposed in a mesh shape extending in each of the first direction and the second direction while being disposed between the contiguous (or adjacent) photoelectric conversion elements fully surrounding a peripheral region of each photoelectric conversion element, such that crosstalk between the contiguous (or adjacent) photoelectric conversion elements can be minimized.

In another embodiment, the second isolation region 260 may be formed in a shape that does not fully surround a peripheral region of each photoelectric conversion element and is formed in a manner that at least a portion of the peripheral region of each photoelectric conversion element is opened.

The second isolation region 260 may form a Deep Trench Isolation (DTI) structure through a trench process, and may be formed by depositing or gap-filling an insulation material in the DTI structure. In this example, the insulation material may be a silicon oxide material, and other implementations are also possible. In addition, the insulation material may be different in refractive index from the substrate. For example, the insulation material may have a lower refractive index than the substrate. In some implementations, a high-reflectivity material (e.g., silver (Ag), aluminum (Al), etc.) may be applied onto the outside of the insulation material. In this case, the DTI structure may be formed through a trench process about the back side from among the front side and the back side of the substrate. In this case, the resultant DTI structure will hereinafter be referred to as a Backside Deep Trench Isolation (B-DTI) structure.

The second isolation region 260 may be formed to be deeply etched in a vertical direction, so that the second isolation region 260 can electrically or optically isolate each of the contiguous pixels located adjacent to each other.

FIG. 3 is a cross-sectional view illustrating one example of the pixel array taken along a first cutting line shown in FIG. 2 based on some implementations of the disclosed technology.

FIG. 3 is a cross-sectional view 300 illustrating an example of a partial pixel array 200 taken along the first cutting line A-A' shown in FIG. 2. The cross-sectional view of the partial pixel array 200 taken along the second cutting line B-B' shown in FIG. 2 may be substantially identical to the cross-sectional view 300 shown in FIG. 3.

The substrate 310 may be illustrated in the cross-sectional view 300. The first photoelectric conversion element 210, the second photoelectric conversion element 240, the first isolation region 250, the second isolation region 260, and the well region 320 may be disposed in the substrate 310.

In this case, structures and functions of the first photoelectric conversion element 210, the second photoelectric conversion element 240, the first isolation region 250, and the second isolation region 260 have already been disclosed with reference to FIG. 2, and as such a detailed description thereof will hereinafter be given centering upon characteristics shown in FIG. 3.

The first isolation region 250 may be arranged to be in contact with a first surface (i.e., a top surface or a front surface) of the substrate 310 in which the first photoelectric conversion element 210 and the second photoelectric conversion dement 220 are formed. In addition, the second isolation region 260 may be formed to be deeply etched in a vertical direction from a second surface (i.e., a bottom surface or a back surface) opposite to the first surface including the first isolation region 250 to the first surface.

The well region 320 may be doped with P-type impurities in the substrate 310. The well region 320 may he disposed to be in contact with each of the photoelectric conversion dements 210 and 240, the first isolation region 250, and the second isolation region 260. For example, the well region may be formed before each of the photoelectric conversion elements 210 and 240, the first isolation region 250, and the second isolation region 260 are formed.

Each of the first photoelectric conversion dement 210 and the second photoelectric conversion dement 220 may have a predetermined Full Well Capacity (FWC). In this case, the full well capacity (FWC) may denote a maximum capacity capable of accumulating photocharges, and may be decided by a volume, a doping density, etc. of each dement. If photocharges are generated and accumulated to exceed the full well capacity (FWC) of the photoelectric conversion element, the overflowing phenomenon in which photocharges move to the outside of the photoelectric conversion element may occur. Overflown photocharges may be transferred to another pixel contiguous or adjacent to the corresponding pixel, such that the overflown photocharges may generate noise in the pixel signal of the contiguous pixel. As the pixel is gradually miniaturized in size, the full well capacity (FWC) of the photoelectric conversion element can also be reduced, such that the overflowing phenomenon may become more severe due to the reduced FWC.

FIG. 3 shows the flow of photocharges (denoted by negative (−) charges) in the relatively upper portion and the relatively lower portion of the photoelectric conversion elements 210 (PD1) or 240 (PD4) for the specific design example shown in FIG. 2 where PD2 and PD4 are adjacent to each other at a diagonal direction on two opposite sides of the first isolation region 250 and do not share a common floating diffusion region and a pixel circuit. Referring to the flow of photocharges around the relatively upper portion of the photoelectric conversion element PD1 or PD4, when photocharges are generated and accumulated to exceed the full well capacity (FWC) of the photoelectric conversion element 210 or 240, overflown photocharges that occur in the upper portion of the photoelectric conversion element 210 or 240 flow into the well region 320 formed to contact the photoelectric conversion element 210 or 240. In this case, the electric field may be formed by the first isolation region 250 receiving the bias voltage (Vb), and the overflown photocharges can move along the electric field and absorbed into or removed by the first isolation region 250. Therefore, the presence of the first isolation region 250 that is electrically bias with the voltage Vb can be used to reduce the cross talk caused by the overflow photocharges between the PD1 and PD4 and, similarly, to reduce the cross talk caused by the overflow photocharges between the PD2 and PD3.

Referring to the flow of photocharges (denoted by negative(−) charges) around the relatively lower portion of the photoelectric conversion element 210 (PD1) or 240 (PD4), when photocharges are generated and accumulated to exceed the full well capacity (FWC) of the photoelectric conversion element 210 or 240, overflown photocharges that occur in the lower portion of the first photoelectric conversion element 210 or 240 may flow into the well region 320 formed to contact the photoelectric conversion element 210 or 240. The overflown photocharges may have difficulties to flow into another pixel due to the presence of the second isolation region 260 that is deeply etched in a direction generally perpendicular to the substrate 310 (which is a vertical direction in FIG. 3). The second isolation region 260 is generally positioned below the first isolation region 250 in the substrate 310 and is filled with a suitable insulation material. Accordingly, the second isolation region 260 blocks the overflown charges from moving between photoelectric conversion element 210 and 240 and cause the overflown photocharges generated in a photoelectric conversion element to stay in the well region 320 outside of the photoelectric conversion element or stay within the photoelectric conversion element. Thus, the second isolation region 260 is structured to form a physical barrier to physically prevent the movement of the overflown photocharges into another pixel to cause the noise in the pixel signal of the another pixel.

In some implementations, a guide region may be additionally formed below the first isolation region 250. The guide region may be formed in a region between the bottom surface of the first isolation region 250 and the top surface of the second isolation region 260, or may be formed to extend from the bottom surface of the first isolation region 250 to a lower portion of the top surface of the second isolation region 260. In this case, after the guide region is first formed to a predetermined depth in the substrate 310, the DTI structure for forming the second isolation region 260 may be formed.

The guide region may be a P-type (P+) impurity region that has a higher doping density than the well region 320.

In addition, although the width of the guide region may be substantially identical or similar to the width of the first isolation region 250 or the width of the second isolation region 260, other geometries and dimensions of the guide region may be used in various implementations.

The guide region may prevent the overflown photocharges from flowing through the space between the bottom surface of the first isolation region 250 and the top surface of the second isolation region 260. The guide region may have a higher doping density than the well region 320, such that the guide region may have a higher electrical potential than the well region 320. The overflown photocharges scheduled to move through the space between the bottom surface of the first isolation region 250 and the top surface of the second isolation region 260 may flow into the first isolation region 250 or the second isolation region 260 due to the presence of the guide region acting as a potential barrier.

Figure 4:
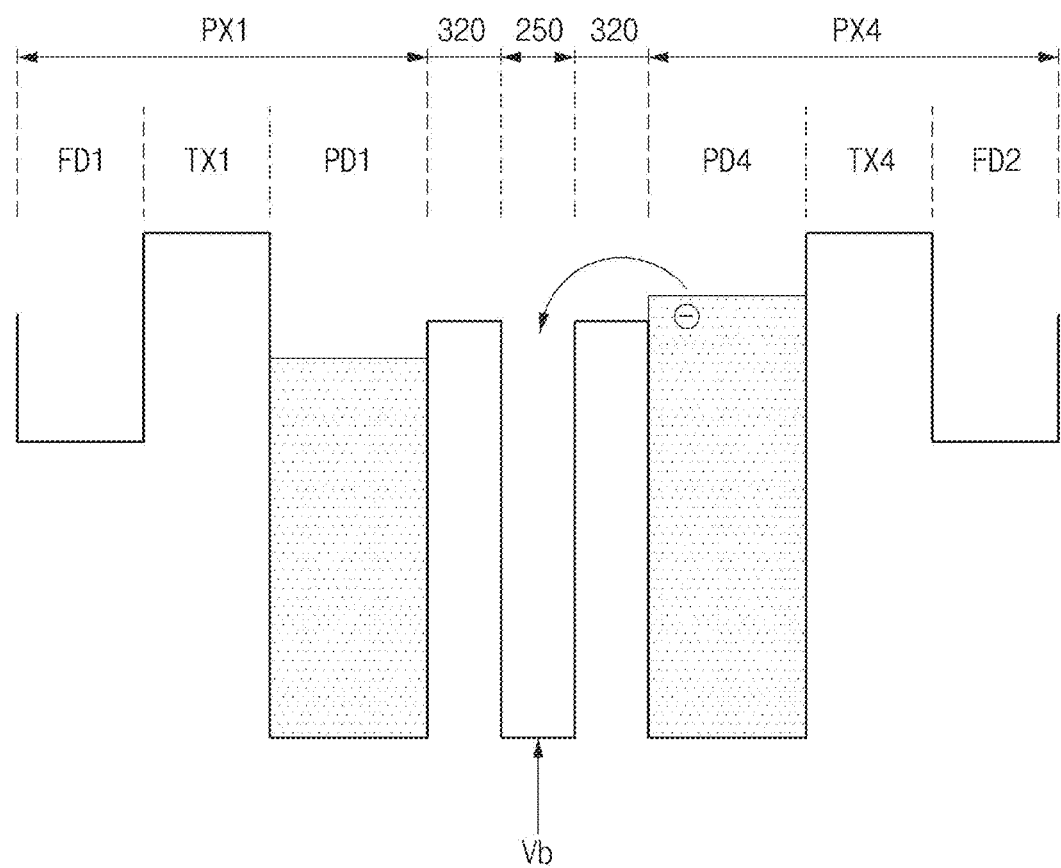
FIG. 4 is a conceptual diagram illustrating potential distribution in the pixel array taken along a third cutting line shown in FIG. 2 based on some implementations of the disclosed technology.

FIG. 4 is a diagram illustrating potential distribution in the pixel array taken along a third cutting line shown in FIG. 2 based on some implementations of the disclosed technology.

FIG. 4 illustrates an example of potential distribution when photocharges are generated and accumulated by incident light in the first photoelectric conversion element 210 and the fourth photoelectric conversion element 240 (e.g., during a photocharge accumulation period). In FIG. 4, the graph shows the potential along a Y direction and being upward means a greater potential. If each transistor is turned off, a potential barrier may be formed, such that charges can be prevented from flowing between the source and drain regions.

In the photocharge accumulation period, each of the first transfer transistor and the fourth transfer transistor is turned off to form the potential barrier, such that charges can be prevented from flowing from the first photoelectric conversion element 210 to the first floating diffusion (FD) region 214 and from the fourth photoelectric conversion element 240 to the second floating diffusion (FD) region 234.

Each of the first photoelectric conversion element 210 and the fourth photoelectric conversion element 240 may generate and accumulate photocharges corresponding to the amount of incident light, such that it is assumed that photocharges are accumulated to exceed the full well capacity (FWC) of the fourth photoelectric conversion element 240 as shown in FIG. 4.

Since the first photoelectric conversion element 210 is surrounded by the well region 320, the well region 320 formed around the first photoelectric conversion element 210 needs to have the same potential. However, since a logic low voltage for turning off the first transfer transistor is applied to the first transfer gate 212, the well region 320 disposed below the first transfer gate 212 may be higher in potential than the well region 320 arranged at another position (e.g. position between the first photoelectric conversion element 210 and the fourth photoelectric conversion element 240).

Since the fourth photoelectric conversion element 240 is surrounded by the well region 320, the well region 320 formed around the fourth photoelectric conversion element 240 needs to have the same potential. However, since a logic low voltage for turning off the fourth transfer transistor s applied to the fourth transfer gate 242, the well region disposed below the fourth transfer gate 242 may be higher in potential than the well region 320 arranged at another position (e.g. position between the first photoelectric conversion element 210 and the fourth photoelectric conversion element 240).

Therefore, when photocharges are accumulated to exceed the full well capacity (FWC) of the fourth photoelectric conversion element 240, the photocharges may overflow into the well region 320 between the first photoelectric conversion element 210 and the fourth photoelectric conversion element 240 instead of the well region disposed below the fourth transfer gate 242. However, the overflown photocharges may be introduced into the first isolation region 250 having a lower potential upon receiving the bias voltage (Vb), such that the resultant overflown photocharges can be removed. Thus, the overflown photocharges may not flow into the first photoelectric conversion element 210, and may be removed by the first isolation region 250.

Likewise, when photocharges are accumulated to exceed the full well capacity (FWC) of the first photoelectric conversion element 210, the photocharges may overflow into the well region 320. However, the overflown photocharges may be introduced into the first isolation region 250 having a lower potential upon receiving the bias voltage (Vb), such that the resultant overflown photocharges can be removed.

Although the functions of the first isolation region 250 have already been disclosed with reference to the relationship between the first pixel PX1 and the second pixel PX2 as shown in FIG. 4, the first isolation region 250 may perform the substantially same function based on the relationship between two arbitrary pixels (e.g., PX1 and PX2, PX2 and PX3, etc.) contiguous or adjacent to each other.

In some implementations, the first isolation region 250 may not always receive the bias voltage (Vb), and the bias voltage (Vb) can be selectively applied to the first isolation region 250 only in a time period (e.g., a photocharge accumulation period) in which overflown photocharges may occur. For example, the bias voltage (Vb) may not be applied to the first isolation region 250 in at least one of a reset period in which the floating diffusion (FD) region is reset, a photocharge transmission period in which photocharges are transferred to the floating diffusion (FD) region, a read-out period in which an electrical signal corresponding to the floating diffusion (FD) region voltage is generated, and an idle period in which pixels are not operated. In this case, power consumption needed to apply the bias voltage (Vb) may be reduced.

As is apparent from the above description, the image sensor based on some implementations of the disclosed technology can electrically and physically prevent overflown photocharges from being transferred between the contiguous (or adjacent) photoelectric conversion elements, resulting in reduction in noise.

Only a few specific examples and embodiments of the disclosed technology are disclosed in this patent document. Various improvements and variations of the disclosed examples and embodiments, and other embodiments may be made based on the disclosure of patent document.

What is claimed is:
1. An image sensor comprising:
a first photoelectric conversion element and a second photoelectric conversion element that are arranged adjacent to each other and doped with first conductive-type impurities, each of the first photoelectric conversion element and the second photoelectric conversion element configured to generate photocharges in response to incident light;

a floating diffusion region configured to store the photocharges from the first photoelectric conversion element and doped with the first conductive-type impurities;

a transfer transistor coupled between the first photoelectric conversion element and the floating diffusion region and overlapping with the floating diffusion region;

a first isolation region located between the first photoelectric conversion element and the second photoelectric conversion element to isolate the first and second photoelectric conversion elements and disposed apart from the floating diffusion region and the transfer transistor, and doped with the first conductive-type impurities, and configured to receive a voltage; and a second isolation region separated from the first isolation region, the second isolation region located between the first photoelectric conversion element and the second photoelectric conversion element and structured to include an insulation material; and a guide region disposed between a bottom surface of the first isolation region and a top surface of the second isolation region, and doped with second conductive-type impurities.

2. The image sensor according to claim 1, wherein the first conductive-type is N-type and the second conductive-type is P-type.

3. The image sensor according to claim 1, wherein:
the first isolation region is located to be in contact with one surface of a substrate in which the first photoelectric conversion element and the second photoelectric conversion element are included.

4. The image sensor according to claim 3, wherein the second isolation region is located in the substrate to be further away from the one surface of the substrate.

5. The image sensor according to claim 4, wherein:
the second isolation region is formed to be deeply etched in a vertical direction from another surface opposite to the one surface of the substrate to the one surface of the substrate.

6. The image sensor according to claim 1, wherein the voltage corresponds to a power-supply voltage.

7. The image sensor according to claim 1, wherein:
the voltage is applied to the first isolation region during a photocharge accumulation period in which each of the first photoelectric conversion element and the second photoelectric conversion element generates and accumulates photocharges.

8. The image sensor according to claim 1, wherein the guide region is arranged to extend to a lower portion of the bottom surface of the first isolation region and a lower portion of the top surface of the second isolation region, the guide region structured to have a higher doped impurity density than surrounding areas to improve isolation between the first and second photoelectric conversion elements.

9. The image sensor according to claim 1 further comprising:
a well region formed to surround the first photoelectric conversion element and the second photoelectric conversion element, and configured to be in contact with the first isolation region and the second isolation region, and doped with the second conductive-type impurities.

10. The image sensor according to claim 9, wherein:
the guide region has a higher doping density than the well region.

11. An image sensor comprising:
first to fourth photoelectric conversion elements formed in a first (2×2) matrix structure, and doped with first conductive-type impurities, each of the first to fourth photoelectric conversion element configured to generate photocharges in response to receiving incident light;

fifth to eighth photoelectric conversion elements formed in a second (2×2) matrix structure adjacent to the first (2×2) matrix structure, and doped with the first conductive-type impurities, each of the fifth to eighth photoelectric conversion elements configured to generate photocharges in response to receiving incident light;

a first isolation region disposed at a center portion of a third (2×2) matrix structure formed by the first, the second, the fifth and the sixth photoelectric conversion elements, and doped with the first conductive-type impurities, and configured to receive a voltage to generate an electric field to attract photocharges from the first, the second, the fifth and the sixth photoelectric conversion elements; and a second isolation region disposed under the first isolation region, and structured to include an insulation material;

a first floating diffusion region disposed at a center portion of the first (2×2) matrix structure and apart from the first isolation region, and configured to store the photocharges received from the first to fourth photoelectric conversion elements, and doped with the first conductive-type impurities;

a second floating diffusion region disposed at a center portion of the second (2×2) matrix structure and apart from the first isolation region, and configured to store the photocharges received from the fifth to eighth photoelectric conversion elements, and doped with the first conductive-type impurities;

a transfer transistor coupled between the first photoelectric conversion element and the first floating diffusion region, wherein the transfer transistor overlaps with the first floating diffusion region and is disposed apart from the first isolation region;

a guide region disposed between a bottom surface of the first isolation region and a top surface of the second isolation region, and doped with second conductive-type impurities.

12. The image sensor according to claim 11, wherein:
the first photoelectric conversion element and the second photoelectric conversion element are configured to share the first floating diffusion region.

13. The image sensor according to claim 11, wherein the voltage corresponds to a power-supply voltage.

14. The image sensor according to claim 11, wherein:
the second isolation region is formed to be deeply etched in a vertical direction from a second surface opposite to a first surface of a substrate including the first isolation region to the first surface of the substrate.

15. The image sensor according to claim 11, further comprising: a well region surrounding the first to fourth photoelectric conversion elements and doped with the second conductive-type impurities.

16. The image sensor according to claim 15, wherein the guide region has a higher doping density than the well region.

* * * * *